US012804990B2

(12) United States Patent
Krebs et al.

(10) Patent No.: US 12,804,990 B2
(45) Date of Patent: Nov. 17, 2026

(54) FIELD-EFFECT TRANSISTOR, AND METHODS FOR PRODUCTION

(71) Applicant: Robert Bosch GmbH, Stuttgart (DE)

(72) Inventors: Daniel Krebs, Aufhausen (DE); Jens Baringhaus, Sindelfingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 431 days.

(21) Appl. No.: 18/488,325

(22) Filed: Oct. 17, 2023

(65) Prior Publication Data

US 2024/0128342 A1 Apr. 18, 2024

(30) Foreign Application Priority Data

Oct. 18, 2022 (DE) ..................... 10 2022 211 016.1

(51) Int. Cl.

| | |
|---|---|
| ***H10D 64/27*** | (2025.01) |
| ***H10D 30/01*** | (2025.01) |
| ***H10D 30/62*** | (2025.01) |
| ***H10D 62/832*** | (2025.01) |

(52) U.S. Cl.

CPC ......... *H10D 64/513* (2025.01); *H10D 30/024* (2025.01); *H10D 30/62* (2025.01); *H10D 30/6219* (2025.01); *H10D 62/8325* (2025.01)

(58) Field of Classification Search

CPC .... H10D 64/513; H10D 30/024; H10D 30/62; H10D 30/6219; H10D 62/8325; H10D 62/8503; H10D 84/0128; H10D 84/0142; H10D 84/016; H10D 84/038; H10D 84/83; H10D 30/028925; H10D 30/658

See application file for complete search history.

(56) References Cited

U.S. PATENT DOCUMENTS 6,060,747 A * 5/2000 Okumura ............. H10D 64/519 257/341
7,075,147 B2 * 7/2006 Cao ...................... H10D 62/127 257/E29.136
9,484,451 B2 * 11/2016 Chen .................... H10D 62/157
2002/0043684 A1 * 4/2002 Kubo ................... H10D 30/668 257/E29.136
2008/0121986 A1 * 5/2008 Hshieh ............... H10D 30/0295 257/E29.027
2011/0254086 A1 * 10/2011 Hsieh ................... H10D 84/016 257/330
2018/0096849 A1 * 4/2018 Burke .............. H10D 64/01324
2022/0157989 A1 * 5/2022 Saggio ................. H10D 30/668

FOREIGN PATENT DOCUMENTS

DE 69621200 T2 8/2002

* cited by examiner

*Primary Examiner* — Galina G Yushina
(74) *Attorney, Agent, or Firm* — NORTON ROSE FULBRIGHT US LLP

(57) ABSTRACT

A field-effect transistor. The field-effect transistor includes: an n-doped source layer, an n-doped drain layer, a channel layer located vertically between the n-doped source layer and the n-doped drain layer, and several gate trenches extending vertically through the n-doped source layer and through the channel layer to the n-doped drain layer. A fin is respectively formed between each two adjacent gate trenches, wherein at least two of the fins have different widths. A method for production is also described.

14 Claims, 5 Drawing Sheets

FIELD-EFFECT TRANSISTOR, AND METHODS FOR PRODUCTION

FIELD

The present invention relates to a field-effect transistor, in particular to a so-called trench MOSFET, and to methods for its production.

BACKGROUND INFORMATION

Field-effect transistors, in particular so-called MOSFETs, are used in various areas. One variant thereof is called trench MOSFETs or T-MOSFETs, in which a channel is formed vertically. In this case, an n-doped source layer and a channel layer located between it and an n-doped drift layer is penetrated by trenches; gate electrodes are then arranged in such trenches.

SUMMARY

According to the present invention, a field-effect transistor and a method for its production are provided. Advantageous embodiments of the present invention are disclosed herein.

The present invention relates to field-effect transistors, viz., in particular, with trenches, and to their production. According to an example embodiment of the present invention, a field-effect transistor comprises an n-doped source layer as well as an n-doped drift layer, a so-called epitaxy layer or epitaxial layer, or also obtained via implantation). It also comprises a channel layer located vertically between the n-doped source layer and the n-doped drain layer. The channel layer may be p-doped. Furthermore, such a field-effect transistor typically has several gate trenches which extend vertically through the n-doped source layer and through the channel layer to the n-doped drain layer, thus in particular also pass through the channel layer.

Furthermore, according to an example embodiment of the present invention, the field-effect transistor can comprise gate electrodes which are at least partially surrounded by a dielectric (e.g., so-called gate oxide), viz., in particular, in such a way that the gate electrodes are thus isolated from the n-doped source layer, the channel layer, and the n-doped drain layer. Such a gate electrode can be arranged in each gate trench. Each such gate electrode can be formed as one piece or can be divided into at least two parts, viz., in such a way that a region of a bottom of the gate trench remains free of a gate electrode. In this case, the MOSFET is also referred to as a so-called FinMOSFET. In this case, a web, a so-called fin, is respectively formed or present between each two gate trenches. A p-doped shielding region can respectively be formed vertically below the gate trench, and thus in the n-doped drain layer.

It is understood that such a field-effect transistor comprises not only the gate electrodes but also source and drain terminals, which can be formed in a conventional manner.

A particular advantage of a trench MOSFET is that the vertical arrangement makes it possible to arrange many gate electrodes next to one another. The field-effect transistor can in particular be formed as a SiC or GaN field-effect transistor, i.e., a substrate and/or commonly used semiconductor material can be silicon carbide (SiC) or gallium nitride (GaN) since these semiconductor materials have a wide band gap. However, semiconductor materials with an ultra-wide band gap, such as gallium oxide, are also suitable.

The switch-on resistance, threshold voltage, short-circuit resistance, oxide charge, and breakdown voltage in such a field-effect transistor can be optimized by appropriately selecting the geometry, epitaxial layer, and implanted or used dopings.

It has now been shown that, depending on the specific design of the field-effect transistor, very high switching transients, in particular slopes, or time derivatives of the current, can occur. These high switching transients can cause overvoltages and power spikes to occur. Likewise, the steepness of the transfer characteristic at a fixed threshold voltage and a switch-on resistance that decreases more and more can cause problems to occur. In the case of parallelization of MOSFET chips, when small deviations in the threshold voltage occur, very different currents can therefore flow in the individual chips and can thus lead to overheating.

It has surprisingly been found that this problem can be eliminated, or this effect can at least be reduced, by varying the width of the webs or fins. Thus, according to an example embodiment of the present invention, at least two of the fins have different widths. Preferably, each two adjacent fins have different widths. Preferably, a total of at least three different widths for the fins are provided.

This makes it possible for the threshold voltage within a chip to vary within the cell field (with several gate electrodes) from one cell to the next (with one gate electrode each). This is in particular true for widths of fins of less than 500 nm since the threshold voltage then depends on the width. The shifted switching-on/off when passing through the gate voltage theoretically results in a stepped and, in practice, due to variability, a continuously less steep transfer characteristic and thus slower switching transients.

According to an example embodiment of the present invention, such a field-effect transistor can be used alone or together with further field-effect transistors, for example as a circuit breaker. Preferred areas of application are, for example, in an electric powertrain of a vehicle, e.g., in a current transformer (DC/DC converter, inverter) there, in charging devices for electrically operated vehicles, or also in solar inverters.

In addition to the field-effect transistor itself, the present invention also relates to a method for producing such a field-effect transistor. In this case, according to an example embodiment of the present invention, a starting material is provided first, which comprises the following: an n-doped source layer, an n-doped drain layer, and a channel layer located vertically between the n-doped source layer and the n-doped drain layer. Optionally, the n-doped drain layer can comprise an n-doped drift layer and an n-doped spread layer which is located vertically between the channel layer and the n-doped drift layer and has a higher n-doping than the n-doped drift layer.

Furthermore, according to an example embodiment of the present invention, several gate trenches are formed, which extend vertically through the n-doped source layer and through the channel layer to the n-doped drain layer so that a fin is respectively formed between each two gate trenches. This takes place in such a way that at least two of the fins have different widths. Preferably, this takes place such that each two adjacent fins have different widths. Preferably, this takes place such that a total of at least three different widths for the fins are provided.

According to an example embodiment of the present invention, the formation of the several gate trenches can in particular initially comprise a partial formation of the several gate trenches so that a web is respectively formed between each two partially formed gate trenches (this web is not yet the final web), wherein at least two of the webs have different raw widths. Furthermore, the several gate trenches are then finally formed, wherein the webs are respectively narrowed, viz., in particular, evenly, for example by etching. The final fins with the desired widths can thus be obtained. A mask can, for example, be used to form the gate trenches.

According to an example embodiment of the present invention, preferably, viz., in particular, prior to the final formation of the several gate trenches, a p-doped shielding region is formed in the n-doped drift layer at a bottom of a respective gate trench.

According to an example embodiment of the present invention, after the formation of the gate trenches, after the at least partial formation of the gate trench, a gate electrode surrounded at least partially by a dielectric can be introduced into each gate trench. In so doing, at least one but also all gate electrodes can be divided into at least two parts in such a way that, upon introduction, a region of a bottom of the respective gate trench remains free from a gate electrode. Thereafter, the field-effect transistor can be metallized.

It is understood that further steps may be necessary for the final field-effect transistor, such as edge termination as well as contact path lead-throughs and the like; here, common methods can be used. The steps described above, on the other hand, relate in particular to the so-called cell field of the field-effect transistor in which the gate trenches are formed.

Further advantages and embodiments of the present invention emerge from the description herein and the figures.

The present invention is illustrated schematically in the figures on the basis of exemplary embodiments and is described below with reference to the figures.

DETAILED DESCRIPTION OF EXAMPLE EMBODIMENTS

Figure 1:
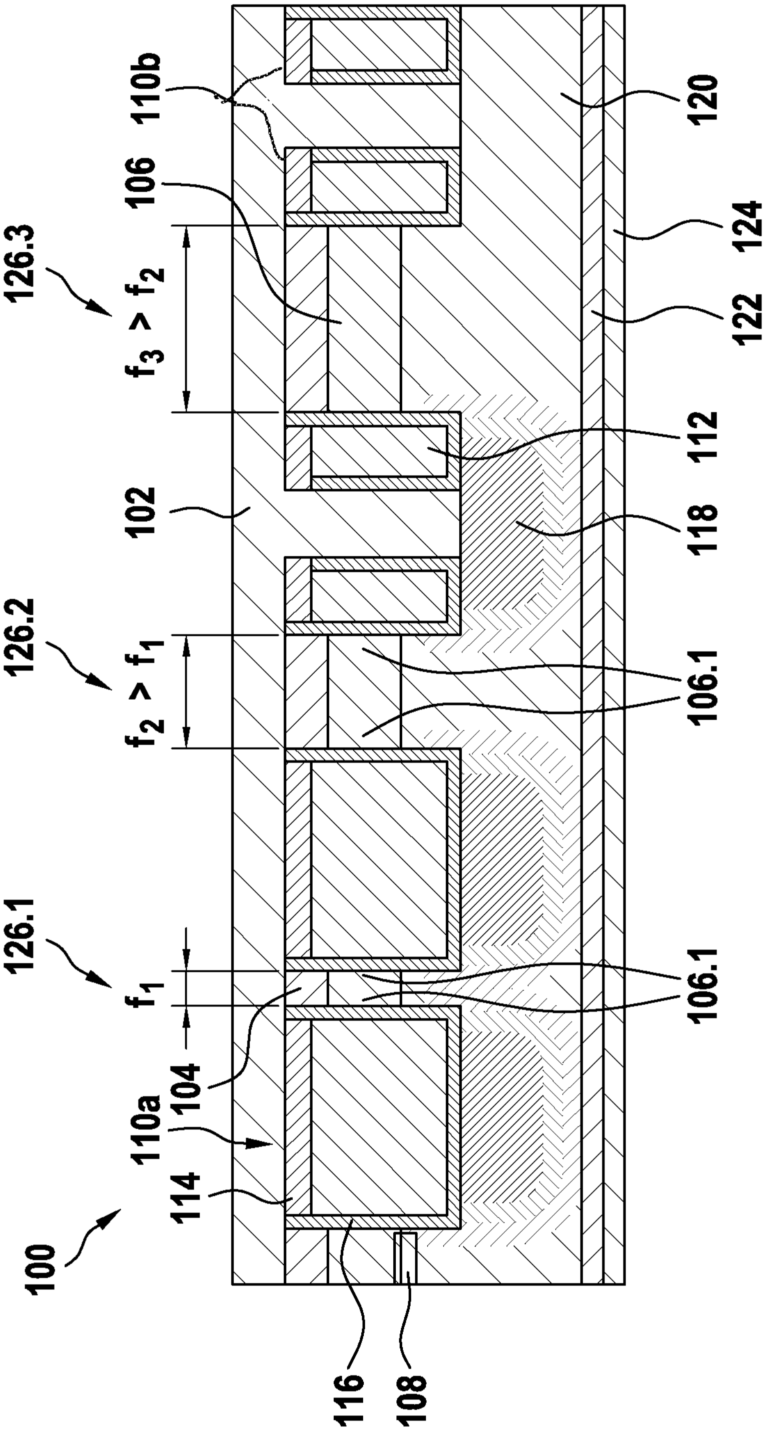
FIG. 1 schematically shows a field-effect transistor according to the present invention in a preferred embodiment.

FIG. 1 schematically shows a field-effect transistor 100 according to the present invention in a preferred embodiment, viz., a so-called trench MOSFET as so-called Fin-MOSFET. Silicon carbide (SiC), gallium nitride (GaN) or gallium oxide can in particular be used as the semiconductor material since these semiconductor materials have a wide to very wide band gap.

The field-effect transistor 100 has an n-doped source layer 104, an n-doped drain layer comprising an n-doped drift layer or so-called epitaxy layer 120, and a channel layer 106 located vertically (viewed here from top to bottom) between the n-doped source layer 104 and the n-doped drift layer. Optionally, the n-doped drain layer can comprise an n-doped spread layer 108 that is located vertically between the channel layer 106 and the n-doped drift layer 120 and has a higher n-doping than the n-doped drift layer 120, which is only indicated here.

Furthermore, the field-effect transistor 100 comprises several gate electrodes 110*a* or 110*b*, which are respectively introduced in one of several gate trenches (not denoted here). The gate electrodes 110*a* and 110*b* respectively have an insulating oxide 114 as well as a dielectric or a gate oxide 116, which surrounds a gate semiconductor material 112. Via the dielectric 116, the gate electrode adjoins at least the channel layer 106. The gate electrodes serve to control a channel zone in the channel layer 106. A channel respectively forms in a region 106.1 of the channel layer 106 that borders the gate trench or a gate electrode. The gate electrodes are typically laid within the gate trenches all the way to the end of the trenches (i.e., the end of the cell field) and are led out of the trenches at this point and contacted or are contacted directly at this point.

Furthermore, the field-effect transistor 100 comprises a p-doped shielding region 118 for each gate trench. In this case, the shielding region 118 is formed in the n-doped drift layer 120. The gate electrode 110*a* completely fills a gate trench. The gate electrode 110*b*, on the other hand, is divided into two parts and therefore does not completely fill a gate trench; rather, a source material 102, e.g., a metal which per se covers the n-doped source layer 104, extends through the two-part gate electrode 110*b*, or the intermediate space thereof, to the bottom of the gate trench, to the shielding region 118.

Between each two of the gate trenches, and thus also between each two of the gate electrodes, a web or a so-called fin is respectively present. By way of example, three fins are denoted by 126.1, 126.2 and 126.3. The width of these fins is denoted by $f_1$, $f_2$ and $f_3$, with $f_1<f_2<f_3$.

Furthermore, the field-effect transistor 100 comprises an n-doped substrate 122 which adjoins the n-doped drift layer 120 at the bottom, and a drain material 124, e.g., a metal which adjoins the n-doped substrate 122 at the bottom.

Figure 2:
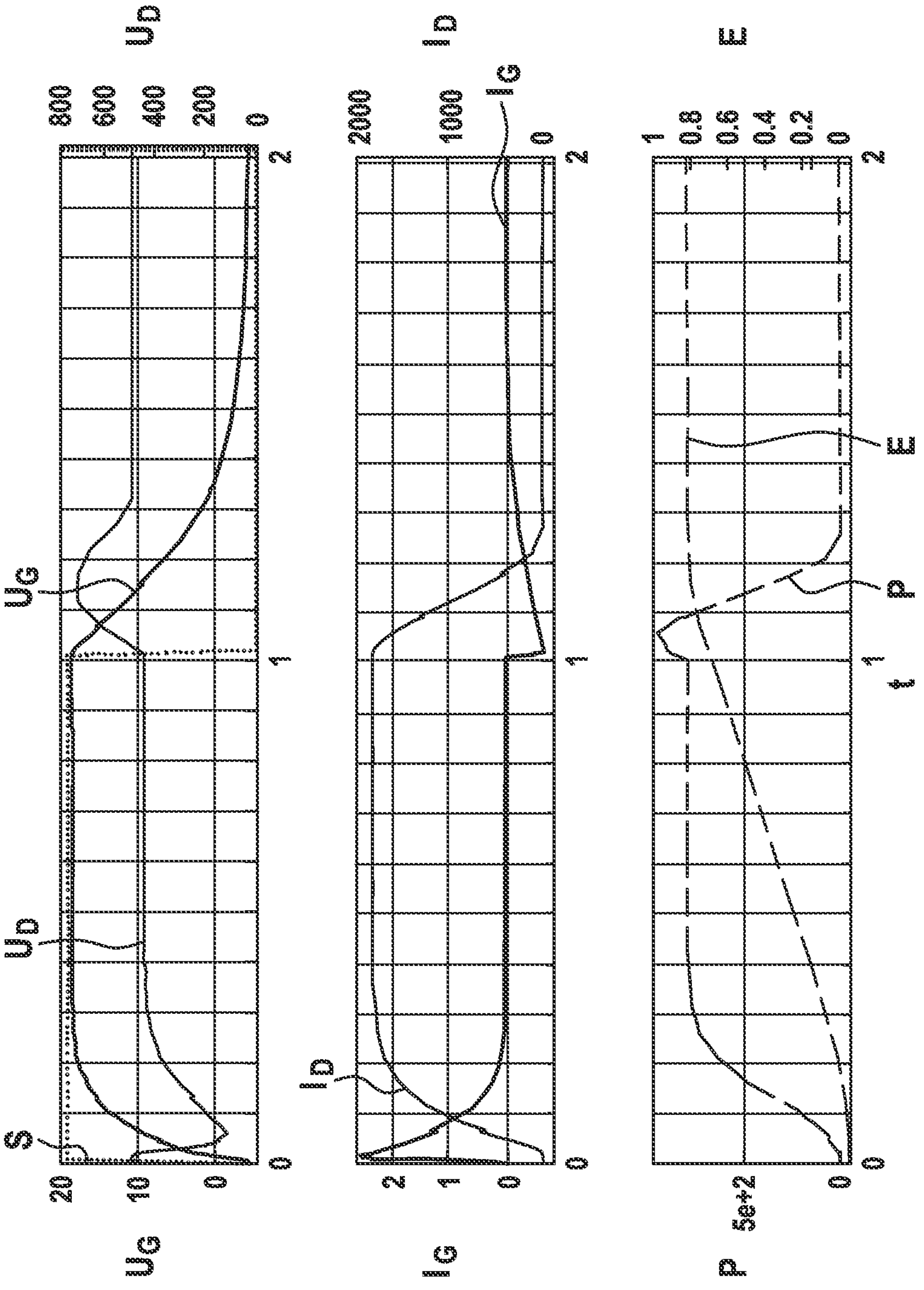
FIG. 2 schematically shows voltage and current profiles for a field-effect transistor not according to the present invention.

FIG. 2 schematically shows voltage and current profiles for a field-effect transistor not according to the present invention, i.e., for example, a field-effect transistor in which the widths of the fins are all the same. Here, a gate voltage $U_G$ (in V), a drain voltage $U_D$ (in V), a gate current $I_G$ (in A), a drain current I (in A), a power P (in kW) and an energy E (in J) are respectively plotted over the time t (in μs).

These are curves for a typical switching operation, which takes place, for example, by means of a signal S (i.e., a voltage at the gate electrode) so that switching-on occurs at time t=0 and switching-off occurs at time t=1 μs.

One problem here may be that the high switching transients dI/dt can cause overvoltages and power spikes to occur. In the center diagram in FIG. 2, the slope of the drain current $I_D$, i.e., $dI_D/dt$, is approx. 10 A/ns. A further problem arises as a result of the steepness of the transfer characteristic at a fixed threshold voltage and a switch-on resistance that decreases more and more. In the case of parallelization of MOSFET chips, when small deviations in the threshold voltage occur, very different currents can thus flow in the individual chips and can thus lead to overheating.

In the proposed field-effect transistor, in which the width of the webs or fins varies, it is possible for the threshold voltage within a chip to vary within the cell field (with several gate electrodes) from one cell to the next (with one gate electrode each). This is in particular true for widths of webs of less than 500 nm since the threshold voltage then depends on the width.

Figure 3:
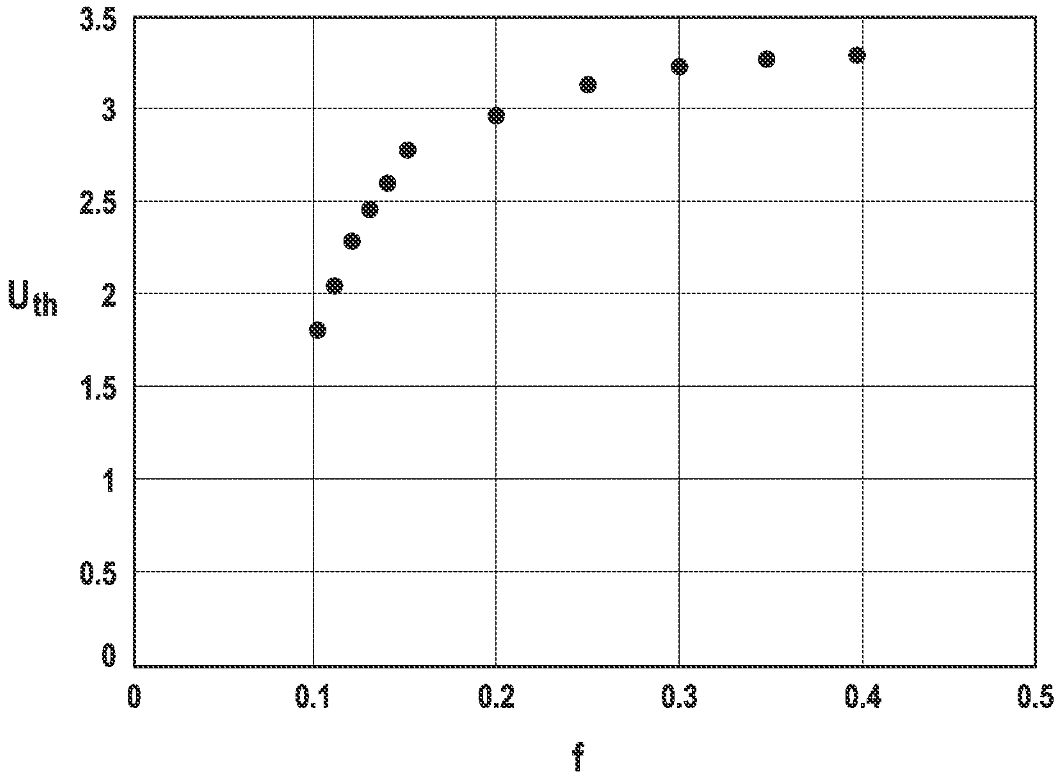
FIG. 3 schematically shows a diagram with threshold voltages.

This is shown in FIG. 3. Here, a threshold voltage Uth (in V) is plotted over a width f of the fin (in μm). A p-doping in the channel is here, by way of example, pCH=4E17/$cm^3$. It can be seen here that the threshold voltage in such field-effect transistors, such as power FinMOSFETs with fin widths less than 500 nm, is dependent on the fin width so that a continuous transfer characteristic results.

The shifted switching-on/off when passing through the gate voltage theoretically results in a stepped and, in practice, due to variability, a continuously less steep transfer characteristic and thus slower switching transients.

Figure 4:
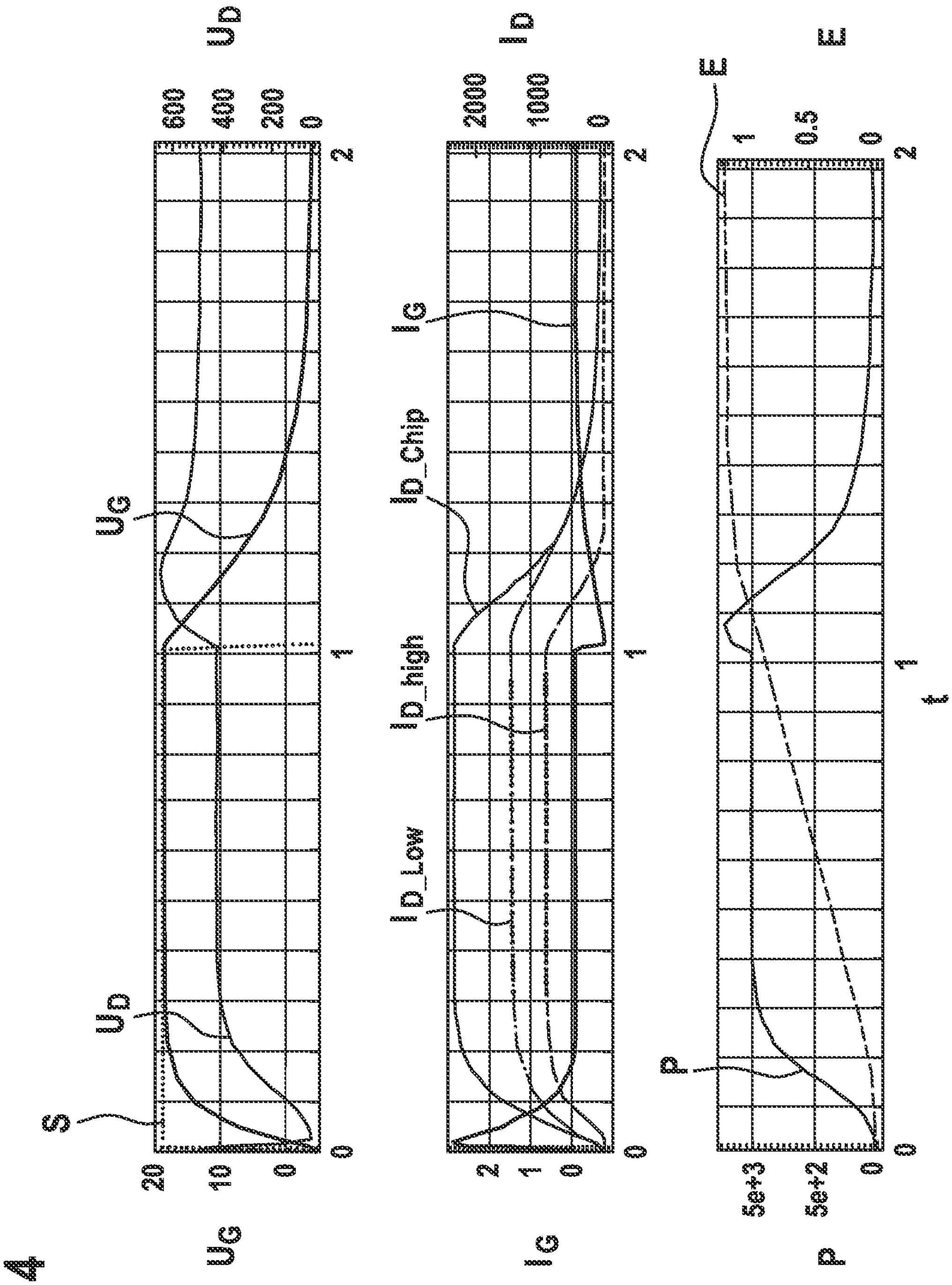
FIG. 4 schematically shows voltage and current profiles for a field-effect transistor according to the present invention in a preferred embodiment.

FIG. 4 schematically shows voltage and current profiles for a field-effect transistor according to the present invention in a preferred embodiment, viz., with (only) two (different) threshold voltages and thus two different widths of the fins. As in FIG. 2, a gate voltage $U_G$ (in V), a drain voltage $U_D$ (in V), a gate current $I_G$ (in A), a drain current I (in A), a power P (in kW) and an energy E (in J) are respectively plotted over the time t (in μs) here.

These are curves for a typical switching operation, which takes place, for example, by means of a signal S (i.e., a voltage at the gate electrode) so that switching-on occurs at time t=0 and switching-off occurs at time t=1 μs.

The current through the channels with lower threshold voltage, $I_{D\_Low}$, increases at smaller threshold voltages and thus earlier in time, and decreases later, than the current through the channels at higher threshold voltage, $I_{D\_high}$. This results in a slower transient at total current in the chip, $I_{D\_Chip}$, and overvoltages and power spikes are reduced. In the center diagram in FIG. 4, the slope of the total drain current $I_{D\_chip}$, i.e., $dI_{D\_Chip}/dt$, is approx. 5 A/ns and thus only half as much as the field-effect transistor according to FIG. 2.

Figure 5:
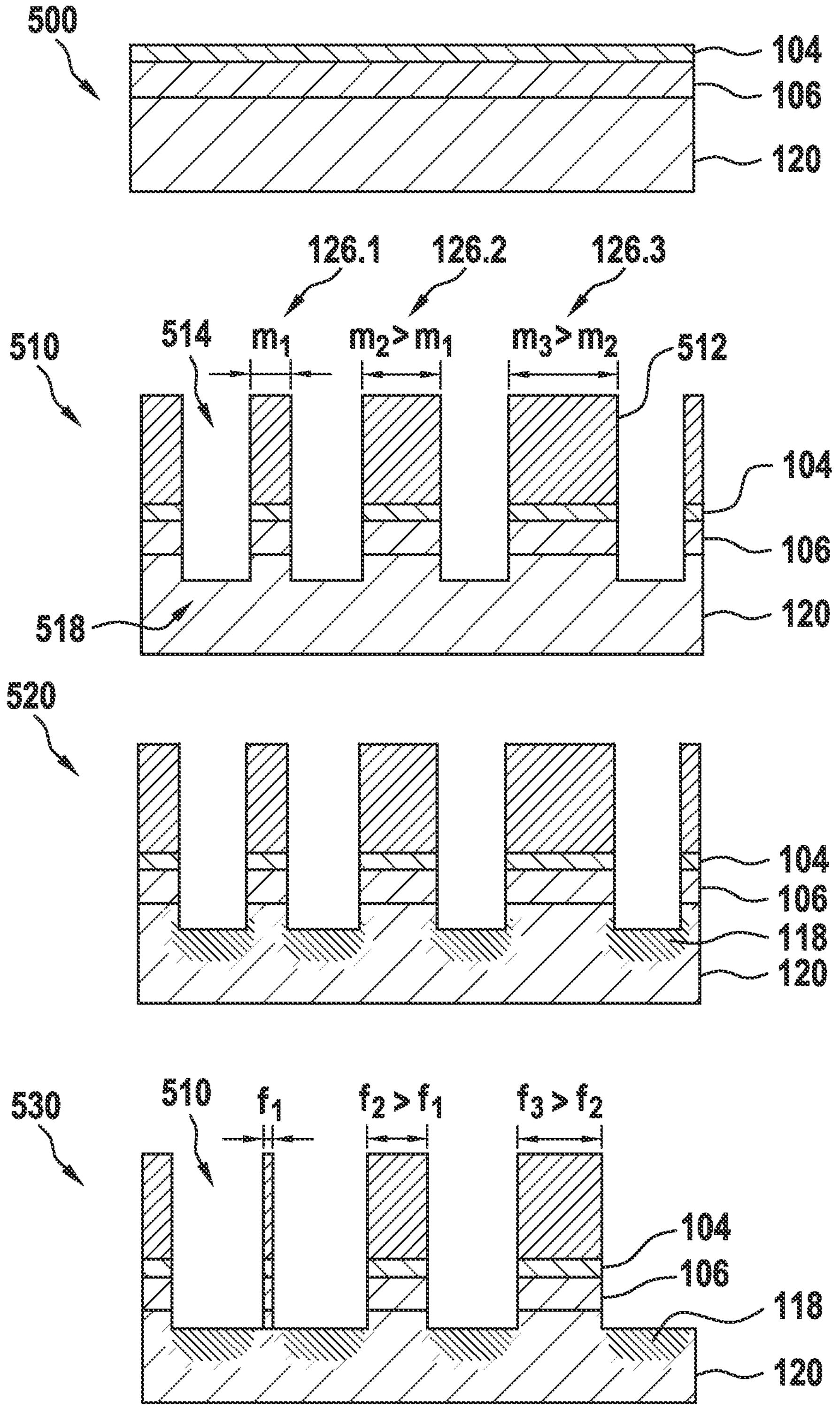
FIG. 5 schematically shows a sequence of a method according to the present invention in a preferred embodiment.

FIG. 5 schematically shows a sequence of a method according to the present invention in a preferred embodiment. It shows respective illustrations for various but not all steps.

In a step 500, a starting material is provided, which comprises an n-doped source layer 104, an n-doped drain layer with an n-doped drift layer 120, and a channel layer 106 located vertically between the n-doped source layer 104 and the n-doped drain layer. Optionally, an n-doped spread layer that has a higher n-doping than the n-doped drift layer can be provided vertically between the channel layer 106 and the n-doped drift layer 120 (not shown here, but see FIG. 1). The channel layer 106 can be or become p-doped. For this purpose, a p-doping in the channel layer can be increased; this is expedient for a FinFET, as explained below.

Several gate trenches 514 are then formed, which extend vertically from the n-doped source layer 104 to the n-doped drain or drift layer 120 and adjoin the channel layer (106) so that a fin is respectively formed between each two gate trenches 514, wherein at least two of the fins have different widths. By way of example, three fins are denoted by 126.1, 126.2, 126.3.

For this purpose, in step 510, the several gate trenches are, for example, initially formed partially or only partially, for example in such a way that they do not yet have the final dimensions for the gate electrodes. This takes place in such a way that a fin, such as 126.1, 126.2, 126.3, is respectively formed between each two partially formed gate trenches, wherein at least two of the fins have different raw widths. These raw widths at this stage are denoted by $m_1$, $m_2$, $m_3$ and do not yet correspond to the final widths of the fins. Nevertheless, these raw widths are different from one another. For this purpose, a mask 512 may, for example, be applied to the n-doped source layer 104 so that etching can take place in its intermediate spaces.

In a step 520, a p-doped shielding region 118 is formed in the n-doped drain or drift layer 120 at a bottom of a respective gate trench 532.

In a step 530, the several gate trenches are then finally formed, wherein the fins are respectively narrowed, in particular evenly, for example by etching. The fins thereby obtain their final widths $f_1$, $f_2$ and $f_3$, respectively.

Further steps can follow in order to finish the field-effect transistor, such as insertion of the gate electrodes, formation of contacts, and metallization, as, for example, the application of drain and source material as shown in FIG. 1.

In addition to the realization of the field-effect transistor as a FinMOS (i.e., with an inversion channel), the field-effect transistor can also be designed as a FinFET (i.e., with an accumulation channel). In this case, in the process flow described above, the step for p-doping in the channel layer is not performed, or a channel layer that is not p-doped is used. In this case, the threshold voltage variation is inverted to the behavior shown in FIG. 2, i.e., narrower webs or fins lead to higher threshold voltages. Apart from that, the operating principle is analogous.

The invention claimed is:

1. A field-effect transistor, comprising:
- an n-doped source layer;
- an n-doped drain layer;
- a channel layer located vertically between the n-doped source layer and the n-doped drain layer; and
- several gate trenches which extend vertically through the n-doped source layer and through the channel layer to the n-doped drain layer;
- wherein a respective fin is formed between each two adjacent gate trenches of the several gate trenches, to provide a plurality of fins, wherein at least two of the plurality of fins have different widths such that a threshold voltage of a channel region associated with each fin of the at least two of the plurality of fins varies, and wherein a width variation is configured to reduce switching transients in the transistor.

2. The field-effect transistor according to claim 1, wherein each two adjacent fins of the plurality of fins have different widths.

3. A field-effect transistor, comprising:
- an n-doped source layer;
- an n-doped drain layer;
- a channel layer located vertically between the n-doped source layer and the n-doped drain layer; and
- several gate trenches which extend vertically through the n-doped source layer and through the channel layer to the n-doped drain layer;
- wherein a respective fin is formed between each two adjacent gate trenches of the several gate trenches, to provide a plurality of fins, wherein at least two of the plurality of fins have different widths,
- wherein the at least three of the plurality of fins in total have at least three different widths.

4. The field-effect transistor according to claim 1, further comprising several gate electrodes, each gate electrode being surrounded, at least partially by a dielectric, wherein the gate electrodes are arranged in a corresponding gate trench of the several gate trenches.

5. The field-effect transistor according to claim 4, wherein at least one of the several gate electrodes is divided into at least two parts in such a way that a region of a bottom of the respective gate trench remains free from a gate electrode.

6. The field-effect transistor according to claim 1, wherein the channel layer is p-doped.

7. The field-effect transistor according to claim 1, further comprising a p-doped shielding region vertically below a respective gate trench, in the n-doped drain layer.

8. The field-effect transistor according to claim 1, wherein the field-effect transistor is a SiC or GaN or gallium-oxide field-effect transistor.

9. A method for producing a field-effect transistor, comprising the following steps:

providing a starting material including: an n-doped source layer, an n-doped drain layer, and a channel layer located vertically between the n-doped source layer and the n-doped drain layer;

forming several gate trenches, which extend vertically through the n-doped source layer and through the channel layer to the n-doped drain layer so that a respective fin is respectively formed between each two adjacent trenches of the several gate trenches to provide a plurality of fins, wherein at least two of the plurality of fins have different widths such that a threshold voltage of a channel region associated with each fin of the at least two of the plurality of fins varies, and wherein a width variation is configured to reduce switching transients in the transistor.

10. A method for producing a field-effect transistor, comprising the following steps:

providing a starting material including: an n-doped source layer, an n-doped drain layer, and a channel layer located vertically between the n-doped source layer and the n-doped drain layer;

forming several gate trenches, which extend vertically through the n-doped source layer and through the channel layer to the n-doped drain layer so that a respective fin is respectively formed between each two adjacent trenches of the several gate trenches to provide a plurality of fins, wherein at least two of the plurality of fins have different widths;

wherein the formation of the several gate trenches includes:

partially forming the several gate trenches so that the respective fin is respectively formed between each two adjacent gate trenches of the partially formed gate trenches, wherein at least two of the fins have different raw widths, and finally forming the several gate trenches, wherein the fins are respectively narrowed evenly.

11. The method according to claim 10, further comprising, prior to the final formation of the several gate trenches: forming a p-doped shielding region in the n-doped drain layer at a bottom of a respective gate trench.

12. The method according to claim 9, further comprising, after the formation of the several gate trenches: introducing a gate electrode, which is surrounded at least partially by a dielectric, into each respective gate trench of the gate trenches.

13. The method according to claim 12, wherein at least one of the gate electrodes is divided into at least two parts in such a way that, upon introduction, a region of a bottom of the respective gate trench remains free from a gate electrode.

14. The method according to claim 12, further comprising, after introduction of the gate electrodes: metallizing by covering the n-doped source layer with a metal.

* * * * *